US011977289B2

(12) United States Patent
Wang et al.

(10) Patent No.: US 11,977,289 B2
(45) Date of Patent: May 7, 2024

(54) WIDE-VIEWING-ANGLE OPTICAL FILM, MANUFACTURING METHOD OF THE SAME, AND LIQUID CRYSTAL DISPLAY DEVICE

(71) Applicant: TCL CHINA STAR OPTOELECTRONICS TECHNOLOGY CO., LTD., Shenzhen (CN)

(72) Inventors: Yue Wang, Shenzhen (CN); Ji Li, Shenzhen (CN)

(73) Assignee: TCL CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 17/875,867

(22) Filed: Jul. 28, 2022

(65) Prior Publication Data

US 2024/0019730 A1 Jan. 18, 2024

(30) Foreign Application Priority Data

Jul. 12, 2022 (CN) .......................... 202210821922.3

(51) Int. Cl.
*G02F 1/1335* (2006.01)
*G03F 7/00* (2006.01)
(Continued)

(52) U.S. Cl.
CPC .. *G02F 1/133504* (2013.01); *G02F 1/133528* (2013.01); *G03F 7/0007* (2013.01);
(Continued)

(58) Field of Classification Search
CPC ......... G02F 1/133504; G02F 1/133528; G02F 2001/133607; G02F 1/133606;
(Continued)

(56) References Cited

U.S. PATENT DOCUMENTS

2002/0064895 A1* 5/2002 Wu .................... G02F 1/133707
438/30
2005/0046943 A1* 3/2005 Suganuma ........... G02B 5/3058
359/487.03

(Continued)

FOREIGN PATENT DOCUMENTS

CN 101283313 A 10/2008
CN 102483474 A 5/2012
(Continued)

OTHER PUBLICATIONS

Chinese Office Action issued in corresponding Chinese Patent Application No. 202210821922.3 dated Apr. 25, 2023, pp. 1-9, 23pp.

*Primary Examiner* — Mariam Qureshi
(74) *Attorney, Agent, or Firm* — The Roy Gross Law Firm, LLC; Roy Gross (57) ABSTRACT

Provided are a wide-viewing-angle optical film, a manufacturing method of the wide-viewing-angle optical film, and a liquid crystal display device. The manufacturing method includes: providing a substrate and forming a first light-transmissive layer at one side of the substrate; performing light treatment on the first light-transmissive layer to form protrusions on a surface of the first light-transmissive layer; and forming a second light-transmissive layer on one side of the first light-transmissive layer away from the substrate, in (Continued)

which a refractive index of a material of the second light-transmissive layer is greater than a refractive index of a material of the first light-transmissive layer to obtain a wide-viewing-angle film including the first light-transmissive layer and the second light-transmissive layer stacked on each other.

11 Claims, 5 Drawing Sheets

(51) Int. Cl.
  *G02B 5/02* (2006.01)
  *G02B 5/30* (2006.01)
(52) U.S. Cl.
  CPC ............ *G02B 5/021* (2013.01); *G02B 5/0268* (2013.01); *G02B 5/3016* (2013.01)
(58) Field of Classification Search
  CPC .......... G02F 1/133602–133614; G03F 7/0007; G02B 5/021; G02B 5/0268; G02B 5/3016; G02B 6/005; G02B 6/0033–0063
  See application file for complete search history.

(56) References Cited

U.S. PATENT DOCUMENTS

| | | | |
|---|---|---|---|
| 2009/0316095 A1* | 12/2009 | Do | G02F 1/13363 |
| | | | 349/118 |
| 2014/0353626 A1 | 12/2014 | Shim et al. | |
| 2016/0068756 A1* | 3/2016 | Moriya | C09K 19/3486 |
| | | | 428/1.31 |
| 2016/0077393 A1* | 3/2016 | Lee | G02F 1/133345 |
| | | | 174/250 |
| 2019/0004357 A1* | 1/2019 | Morinaga | G02F 1/136286 |
| 2019/0386251 A1* | 12/2019 | Erickson | H10K 50/858 |
| 2020/0379300 A1* | 12/2020 | Son | G02F 1/133507 |
| 2021/0247645 A1* | 8/2021 | Kim | G02F 1/133504 |

FOREIGN PATENT DOCUMENTS

| | | |
|---|---|---|
| CN | 108287429 A | 7/2018 |
| CN | 109799562 A | 5/2019 |
| CN | 114690477 A | 7/2022 |
| CN | 114994814 A | 9/2022 |
| JP | 2004294745 A | 10/2004 |

* cited by examiner

WIDE-VIEWING-ANGLE OPTICAL FILM, MANUFACTURING METHOD OF THE SAME, AND LIQUID CRYSTAL DISPLAY DEVICE

CROSS REFERENCE TO RELATED APPLICATIONS

This application claims the benefit of priority of Chinese Patent Application No. 202210821922.3, filed Jul. 12, 2022, the contents of which are all incorporated herein by reference in their entirety.

The present application relates to a field of display technology and in particular, to a wide-viewing-angle optical film, a manufacturing method of the wide-viewing-angle optical film, and a liquid crystal display device.

DESCRIPTION OF RELATED ART

With the development of liquid crystal display (LCD) technology, LCDs are widely used in display devices in household appliances and public places because LCDs can realize large-sized screens, high resolution, and has advantages of being smaller and lighter compared with cathode ray tube (CRT) display devices.

However, LCDs usually have the best display performance in a direction perpendicular to display screens, and the farther from the normal, the worse the display performance. That is to say, the LCDs have a narrower range of viewing angles. In order to enlarge the viewing angles of the LCDs, there is a solution to attach a wide-viewing-angle optical film onto an LCD panel to uniformly diffuse outgoing light of the LCD panel, so that users can see images with consistent quality when viewing the LCD device from various angles.

Conventional wide-viewing-angle optical films are usually produced by a pressing method, and the pressing process requires the use of molds. As the size of the liquid crystal display devices demanded by the market is getting larger and larger, the molds used to manufacture the wide-viewing-angle optical films also need to have larger sizes, resulting in increased difficulty in making the molds, and production costs of the molds also increase. That is to say, the production difficulty and production costs of the wide-viewing-angle optical films are increasing.

SUMMARY

The present application provides a wide-viewing-angle optical film, a manufacturing method thereof, and a liquid crystal display device, which can reduce the difficulty in producing the wide-viewing-angle optical film and reducing production costs of the wide-viewing-angle optical film.

In a first aspect, the present application provides a manufacturing method of a wide-viewing-angle optical film, including:
   providing a substrate and forming a first light-transmissive layer at one side of the substrate;
   performing light treatment on the first light-transmissive layer, so that multiple protrusions are formed on a surface of the first light-transmissive layer; and
   forming a second light-transmissive layer on one side of the first light-transmissive layer away from the substrate, wherein a refractive index of a material of the second light-transmissive layer is greater than a refractive index of a material of the first light-transmissive layer, so that a wide-viewing-angle film is obtained, and the wide-viewing-angle film includes the first light-transmissive layer and the second light-transmissive layer stacked on each other.

In some embodiments, the material of the first light-transmissive layer is a positive photoresist material; and the step of performing the light treatment on the first light-transmissive layer includes:
   providing a first mask, wherein the first mask includes multiple first light-shielding regions arranged at intervals and multiple first light-transmissive regions arranged around the first light-shielding regions;
   disposing the first mask between a light source and the first light-transmissive layer, so that light emitted by the light source passes through the first-transmissive regions and irradiates the first light-transmissive layer; and
   developing the first light-transmissive layer, so that a thickness of the first light-transmissive layer is reduced in areas corresponding to the first light-transmissive regions, and the first light-transmissive layer forms the protrusions at positions corresponding to the first light-shielding regions.

In some embodiments, the material of the first light-transmissive layer is a negative photoresist material; and the step of performing the light treatment on the first light-transmissive layer includes:
   providing a second mask, wherein the second mask includes multiple second light-transmissive regions arranged at intervals and multiple second light-shielding regions arranged around the second light-transmissive regions;
   disposing the second mask between a light source and the first light-transmissive layer, so that the light emitted by the light source passes through the second light-transmissive regions and irradiates the first light-transmissive layer; and
   developing the first light-transmissive layer, wherein a thickness of the first light-transmissive layer is reduced in areas corresponding to the second light-shielding regions, so that the first light-transmissive layer forms the protrusions at positions corresponding to the second light-transmissive regions.

In some embodiments, the step of performing the light treatment on the first light-transmissive layer includes:
   irradiating the first light-transmissive layer with laser light, so that a thickness of the first light-transmissive layer is reduced at positions irradiated by the laser light, and the first light-transmissive layer forms the protrusions at positions non-irradiated by the laser light, and the protrusions are arranged at intervals.

In some embodiments, before the first light-transmissive layer is disposed at one side of the substrate, the manufacturing method of the wide-viewing angle optical film further includes:
   disposing a polarizing film on the substrate, wherein the polarizing film is arranged between the substrate and the wide-viewing-angle film.

In some embodiments, the polarizing film is formed by coating.

In some embodiments, the step of disposing the polarizing film on the substrate includes:
   coating an alignment material on the substrate and drying the alignment material to obtain an alignment layer;
   coating an iodine-containing material on a surface of the alignment layer;

using a solvent to wash the surface of the alignment layer to remove a portion of the iodine-containing material that does not enter the alignment layer; and drying the alignment layer to form the polarizing film.

In some embodiments, the alignment material is a liquid crystal material, and the iodine-containing material is an iodine solution;

the alignment material is dried by a drying method with drying temperatures of 40° C. to 60° C. and a drying time from 0.1 minute to 10 minutes; and the alignment layer is dried by the drying method with the drying temperatures of 40° C. to 60° C. and the drying time from 0.1 minute to 10 minutes.

In a second aspect, the present application provides a wide-viewing-angle optical film, produced using the manufacturing method of the wide-viewing-angle optical film mentioned above, wherein the wide-viewing-angle optical film includes a substrate and a wide-viewing-angle film disposed at one side of the substrate.

In a third aspect, the present application provides a liquid crystal display device, including:

a liquid crystal display panel; and a wide-viewing-angle optical film arranged on a light-emitting side of the liquid crystal display panel, wherein the wide-viewing-angle optical film is the wide-viewing-angle optical film mentioned above.

In the manufacturing method of the wide-viewing-angle optical film according to one embodiment of the present application, the first light-transmissive layer forms multiple protrusions by performing light treatment on the first light-transmissive layer. Compared with conventional techniques which produce the protrusions by a pressing method, the present application does not require a pressing mold, thus eliminating problems like great difficulty in making the pressing mold and high production costs in conventional manufacturing methods of the wide-viewing-angle optical film. Moreover, the present application can simplify a production process of the wide-viewing-angle optical film, reduce difficulty in producing the wide-viewing-angle optical film, and reduce production costs of the wide-viewing-angle optical film.

BRIEF DESCRIPTION OF DRAWINGS

In order to more clearly illustrate the embodiments of the present application, figures which will be described in the embodiments are briefly introduced hereinafter.

DETAILED DESCRIPTION OF EMBODIMENTS

The technical solutions of the present application are clearly and completely described below with reference to the accompanying drawings and in conjunction with specific embodiments.

Obviously, the described embodiments are only some of the embodiments of the present application, but not all of the embodiments. Based on the embodiments of the present application, all other embodiments obtained by those skilled in the art without creative efforts shall fall within the protection scope of the present application.

Figure 1:
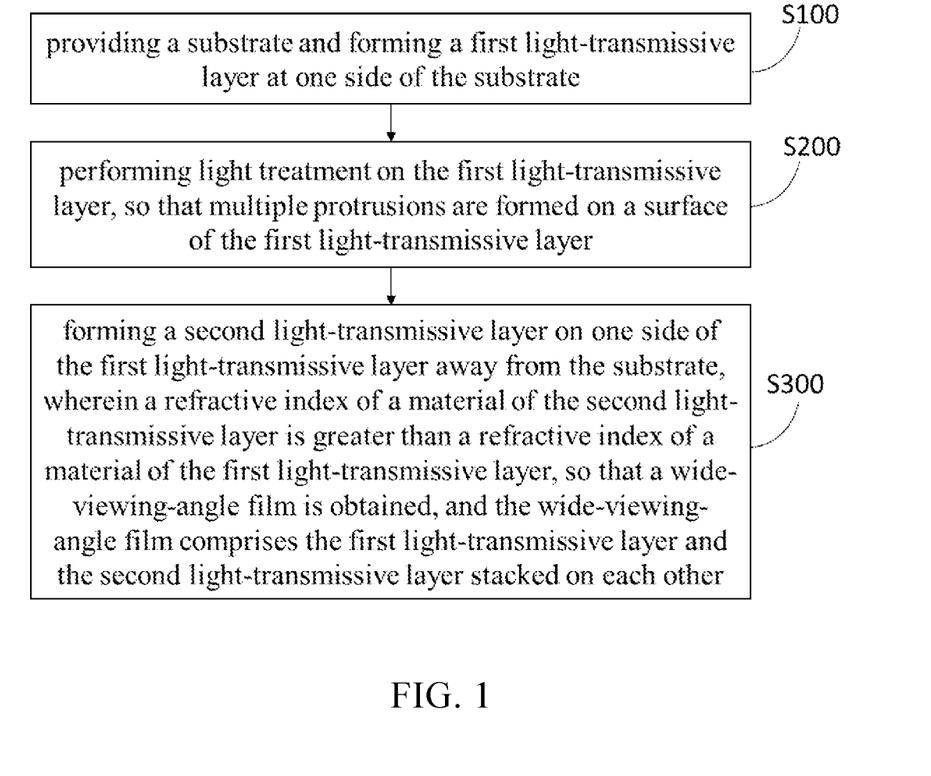
FIG. 1 is a manufacturing method of a wide-viewing-angle optical film according to one embodiment of the present application.

Please refer to FIG. 1. FIG. 1 is a process flow diagram illustrating a manufacturing method of a wide-viewing-angle optical film according to one embodiment of the present application, including steps as follows.

S100: providing a substrate 10 and forming a first light-transmissive layer 21 at one side of the substrate 10.

In one example, a material of the substrate 10 can include at least one of organic materials such as triacetyl cellulose (TAC), polyethylene terephthalate (PET), cyclo olefin polymer (COP), and polymethyl methacrylate (PMMA).

In the present application, "at least one" includes "one", "two", or "more than two" (e.g., three, four, five, and six).

In one example, before the step of disposing the first light-transmissive layer 21 at one side of the substrate 10, the manufacturing method of the wide-viewing-angle optical film can further include:

disposing a polarizing film 50 on the substrate 10, wherein the polarizing film 50 is disposed between the substrate 10 and a wide-viewing-angle film 20. It can be understood that when the polarizing film 50 is arranged between the substrate 10 and the wide-viewing-angle film 20, the produced wide-viewing-angle optical film 110 not only has the functions of scattering light and widening viewing angles of a liquid crystal display device 100, but also has the function of a polarizer.

In one example, the polarizing film 50 can be produced by coating. In some embodiments, "the step of disposing the polarizing film 50 on the substrate 10" can specifically include:

coating an alignment material 61 on the substrate 10 and drying the alignment material 61 to obtain the alignment layer 60;

coating an iodine-containing material on a surface of the alignment layer 60;

using a solvent to wash the surface of the alignment layer 60 to remove a portion of the iodine-containing material that does not enter the alignment layer 60; and drying the alignment layer 60 to form the polarizing film 50.

Figure 2:
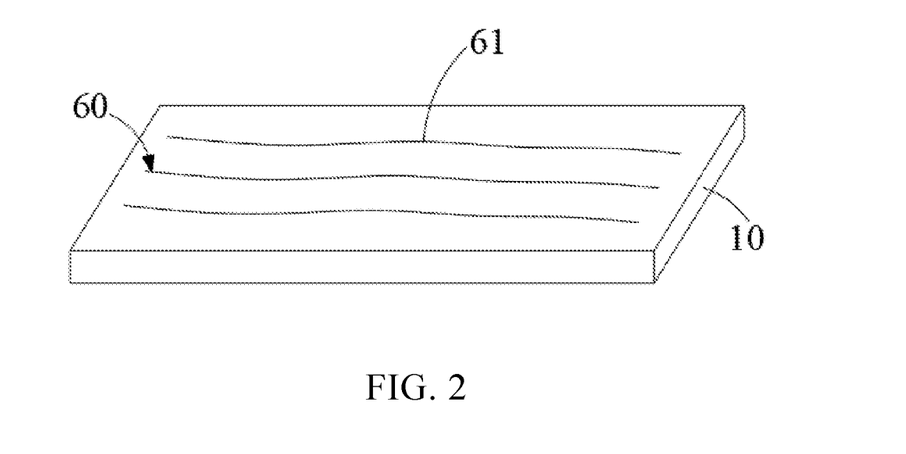
FIG. 2 is a schematic view showing the present application after an alignment layer is disposed on a substrate according to one embodiment.
Figure 3:
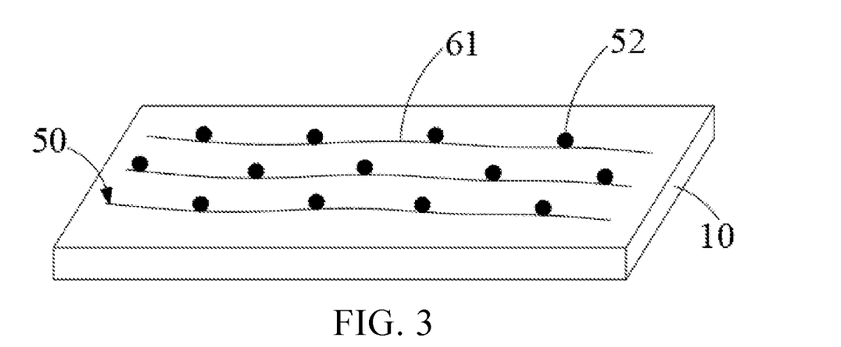
FIG. 3 is a schematic view showing the present application after an iodine-containing material is disposed on the alignment layer according to one embodiment.

Please refer to FIGS. 2 and 3. FIG. 2 is a schematic view after the alignment layer is disposed on the substrate according to one embodiment of the present application. FIG. 3 is a schematic view after an iodine-containing material is disposed on the alignment layer according to one embodiment of the present application. It can be seen from FIG. 2 that the alignment material 61 in the alignment layer 60 have the same orientation, and it can be seen from FIG. 3 that iodine 52 (iodine molecules and/or iodine ions) can enter the alignment layer 60 and attach to the alignment material 61, a polarization function is realized through the coordination between the alignment material 61 and the iodine molecules.

In one example, the alignment material 61 is a liquid crystal material (e.g., lyotropic liquid crystal), and the iodine-containing material is an iodine solution.

In one example, the alignment material 61 is dried by using a drying method, drying temperatures range from 40° C. to 60° C. (e.g., 40° C., 45° C., 50° C., 55° C., and 60° C.), and a drying time is from 0.1 minute to 10 minutes (e.g., 0.1 minute, 0.5 minute, 1 minute, 3 minutes, 5 minutes, 7 minutes, and 10 minutes).

In one example, after the surface of the alignment layer 60 is washed with the solvent, the alignment layer 60 is dried by the drying method, the drying temperatures range from 40° C. to 60° C. (e.g., 40° C., 450 C, 50° C., 55° C., and 60° C.), and the drying time is from 0.1 minute to 10 minutes (e.g., 0.1 minute, 0.5 minute, 1 minute, 3 minutes, 5 minutes, 7 minutes, and 10 minutes).

In one example, after the surface of the alignment layer 60 is coated with the iodine-containing material, it can be left still for 5 minutes to 60 minutes (e.g., 5 minutes, 10 minutes, 15 minutes, 20 minutes, 25 minutes, 30 minutes, 35 minutes, 40 minutes, 45 minutes, 50 minutes, 55 minutes, and 60 minutes). Then, after the iodine 52 in the iodine-containing material enters the alignment layer 60, the surface of the alignment layer 60 is washed with the solvent (e.g., ethanol).

In conventional techniques, the polarizing film is usually produced by dyeing, stretching, and shaping polyvinyl alcohol (PVA) and then combining the PVA with two protective layers. Stretching and dyeing processes of PVA have high standard requirements for production equipment and production techniques. In addition to that, the market requires liquid crystal display devices to have larger sizes, so polarizing films need to have larger sizes. However, limited by a stretching ratio of PVA, conventional PVA stretching processes can no longer meet the requirements for producing large-sized polarizing films.

In the step of producing the polarizing film 50 according to the present application, the alignment material 61 and the iodine-containing material are disposed by coating. Compared with conventional steps of producing the polarizing film, the stretching and dyeing processes of PVA are omitted from the present invention, thus having lower standard requirements for production equipment and production techniques, thereby simplifying a production process of the polarizing film 50 and reducing production costs. Furthermore, the step of producing the polarizing film 50 is not limited by the stretching ratio of PVA, so a large-sized polarizing film is realized, thus solving a problem of producing large-sized polarizers in the polarizer industry, and realizing large-sized liquid crystal display devices.

Figure 4:
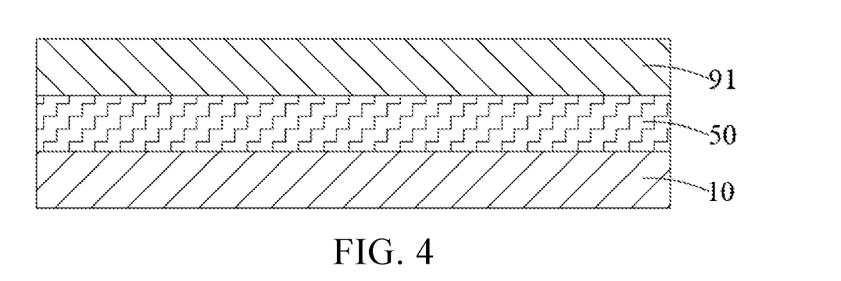
FIG. 4 is a schematic view of a first protective layer disposed on a polarizing film according to one embodiment of the present application.

In one example, as shown in FIG. 4, after the polarizing film 50 is produced, a first protective layer 91 can also be disposed on one side of the polarizing film 50 away from the substrate 10. It can be understood that, by disposing the first protective layer 91 on a surface of the polarizing film 50, the orientation of the alignment material 61 in the polarizing film 50 is prevented from being changed by external influences, and the iodine 52 in the polarizing film 50 can be prevented from escaping, thereby prolonging a service life of the polarizing film 50.

In one example, a material of the first protective layer 91 can include at least one of organic materials such as triacetyl cellulose (TAC), polyethylene terephthalate (PET), cyclo olefin polymer (COP), and polymethyl methacrylate (PMMA).

Figure 5:
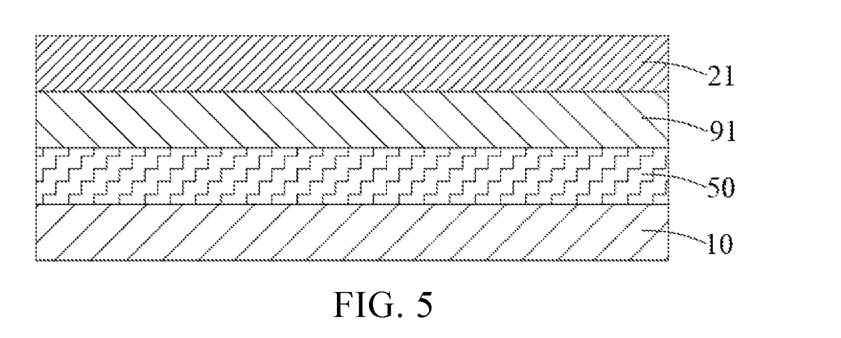
FIG. 5 is a schematic view showing the present application after a first light-transmissive layer is disposed at one side of a substrate according to one embodiment.

Please refer to FIG. 5. FIG. 5 is a schematic view showing the present application after the first light-transmissive layer is disposed at one side of the substrate according to one embodiment. The first light-transmissive layer 21 can be disposed at one side of the substrate 10 by coating, and a material of the first light-transmissive layer 21 can be a photoresist material (e.g., a positive photoresist material or a negative photoresist material).

S200: performing light treatment on the first light-transmissive layer 21 to form multiple protrusions 211 on a surface of the first light-transmissive layer 21.

In the present application, "multiple" refers to two or more, e.g., three, four, five, six, seven, eight, nine, and ten.

Figure 6:
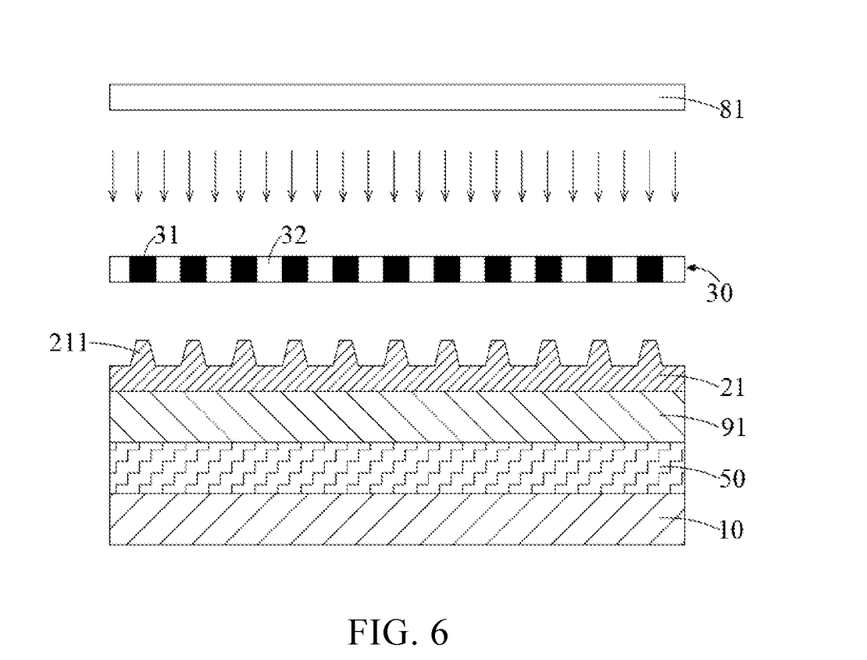
FIG. 6 is a first schematic view of performing light treatment on the first light-transmissive layer according to one embodiment of the present application.

Please refer to FIG. 6. FIG. 6 is a first schematic view of performing the light treatment on the first light-transmissive layer according to one embodiment of the present application. A material of the first light-transmissive layer 21 can be a positive photoresist material. In this case, the step of "performing the light treatment on the first light-transmissive layer 21" can specifically include:

providing a first mask 30, wherein the first mask 30 includes multiple first light-shielding regions 31 arranged at intervals and multiple first light-transmissive regions 32 arranged around the first light-shielding regions 31;

disposing the first mask 30 between the light source 81 and the first light-transmissive layer 21, so that light emitted by the light source 81 passes through the first light-transmissive regions 32 and irradiates the first light-transmissive layer 21; and developing the first light-transmissive layer 21, so that a thickness of the first light-transmissive layer 21 is reduced in areas corresponding to the first light-transmissive regions 32, and the first light-transmissive layer 21 forms the protrusions 211 at positions corresponding to the first light-shielding regions 31.

In one embodiment, the light emitted by the light source 81 is yellow light.

Figure 7:
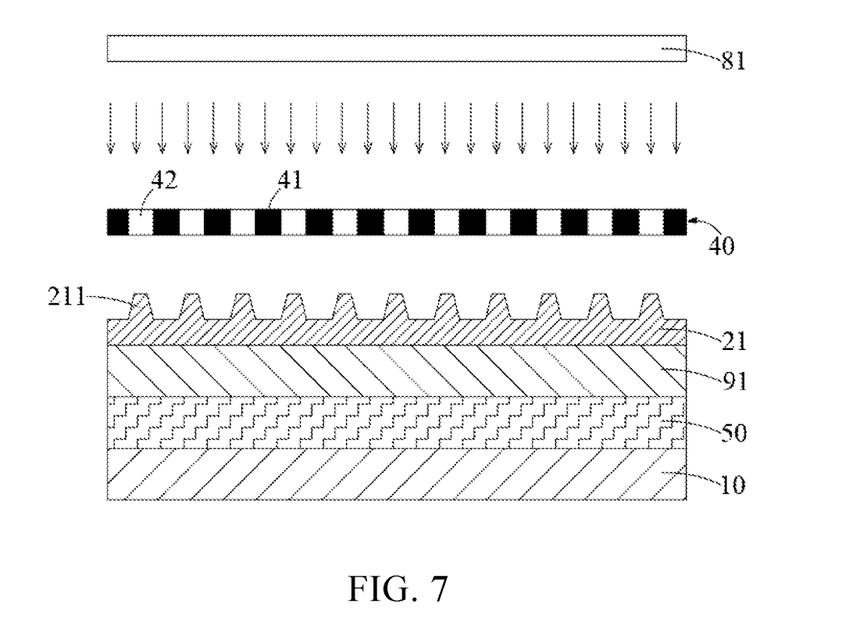
FIG. 7 is a second schematic view of performing the light treatment on the first light-transmissive layer according to one embodiment of the present application.

Please refer to FIG. 7. FIG. 7 is a second schematic view of performing the light treatment on the first light-transmissive layer according to one embodiment of the present application. The material of the first light-transmissive layer 21 can be a negative photoresist material. In this case, the step of "performing the light treatment on the first light-transmissive layer 21" can specifically include:

providing a second mask 40, wherein the second mask 40 includes multiple second light-transmissive regions 42 arranged at intervals and multiple second light-shielding regions 41 arranged around the second light-transmissive regions 42;

disposing the second mask 40 between the light source 81 and the first light-transmissive layer 21, so that the light emitted by the light source 81 passes through the second light-transmissive regions 42 and irradiates the first light-transmissive layer 21; and developing the first light-transmissive layer 21, wherein a thickness of the first light-transmissive layer 21 is reduced at areas corresponding to the second light-shielding regions 41, so that the first light-transmissive layer 21 forms the protrusions 211 at positions corresponding to the second light-transmissive regions 42.

In one example, the light emitted by the light source 81 is yellow light.

Figure 8:
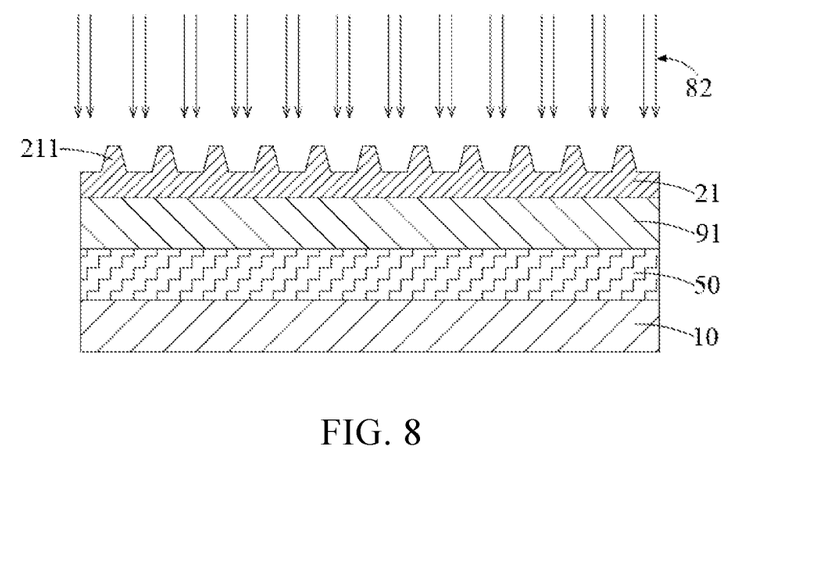
FIG. 8 is a third schematic view of performing the light treatment on the first light-transmissive layer according to one embodiment of the present application.

Please refer to FIG. 8. FIG. 8 is a third schematic view of performing the light treatment on the first light-transmissive layer according to one embodiment of the present application. The step of "performing the light treatment on the first light-transmissive layer 21" can specifically include:

irradiating the first light-transmissive layer 21 with laser light 82, so that a thickness of the first light-transmissive layer 21 is reduced at positions irradiated by the laser light 82, and the first light-transmissive layer 21 forms multiple protrusions at positions non-irradiated by the laser light 82, and the protrusions 211 are arranged at intervals.

In one example, a longitudinal cross-section of the protrusion 211 is a trapezoid (e.g., an isosceles trapezoid), and it can be understood that the longitudinal cross-section refers to a cross-section perpendicular to the substrate 10. In other embodiments, the longitudinal cross-section of the protrusion 211 can also be in other shapes, such as a rectangle, a square, an inverted trapezoid, a semicircle, a triangle, a regular pentagon, a regular hexagon, and the like. That is to say, sides of the protrusion 211 can be a straight line, a polyline, an arc, etc.

Figure 9:
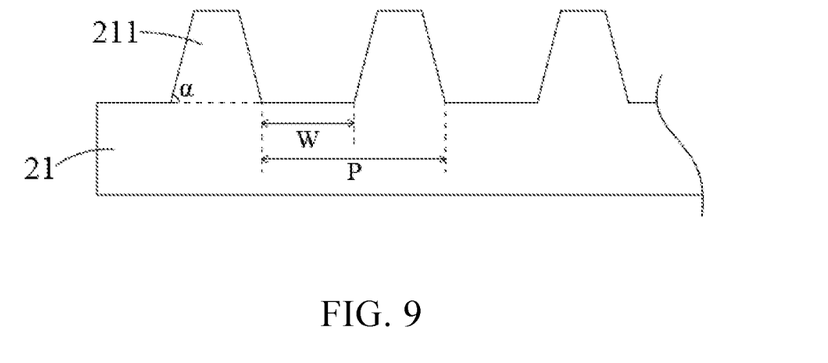
FIG. 9 is a partial enlarged view of the first light-transmissive layer according to one embodiment of the present application.

Please refer to FIG. 9. FIG. 9 is a partial enlarged view of the first light-transmissive layer according to one embodiment of the present application. An included angle α between a lateral side and a bottom side of the protrusion 211 ranges from 400 to 900 (e.g., 40°, 50°, 60°, 70°, 80°, and 90°).

Referring to FIG. 9, a width of the bottom side of the protrusion 211 is W, and a distance between two adjacent protrusions 211 is P, then 1<P/W≤10. In one example, P/W can be 1.2, 1.5, 2, 3, 4, 5, 6, 7, 8, 9, 10, etc. It can be understood that when a value of P/W is greater, it means that the width W of the bottom side of the protrusion 211 is less. That is to say, the less ratio of an area of the protrusion 211 to a total area of the first light-transmissive layer 21 is, the poorer light scattering ability the wide-viewing-angle-film layer 20 provides because the area of the protrusion 211 occupies a small proportion of the total area of the first light-transmissive layer 21. Therefore, the P/W is set to be less than or equal to 10 to ensure that the wide-viewing-angle film 20 has a good light diffusing ability.

In one example, the protrusions 211 are all strip-shaped, and the protrusions 211 are parallel to each other and evenly spaced.

In one example, an upper surface of each protrusion 211 is flat, and surfaces of spaced regions between adjacent protrusions 211 are flat.

S300: providing a second light-transmissive layer 22 on one side of the first light-transmissive layer 21 away from the substrate 10, wherein a refractive index of a material of the second light-transmissive layer 22 is greater than a refractive index of a material of the first light-transmissive layer 21, so that a wide-viewing-angle film 20 is obtained, and the wide-viewing-angle film 20 includes the first light-transmissive layer 21 and the second light-transmissive layer 22 stacked on each other.

Figure 10:
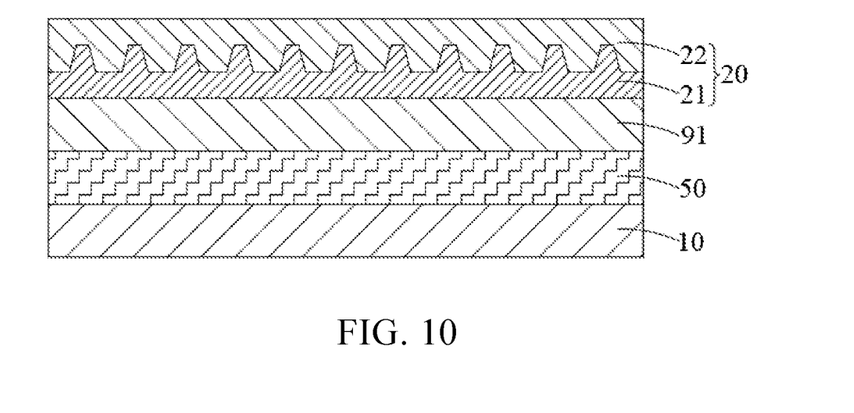
FIG. 10 is a schematic view showing the present application after a second light-transmissive layer is disposed on the first light-transmissive layer according to one embodiment.
Figure 11:
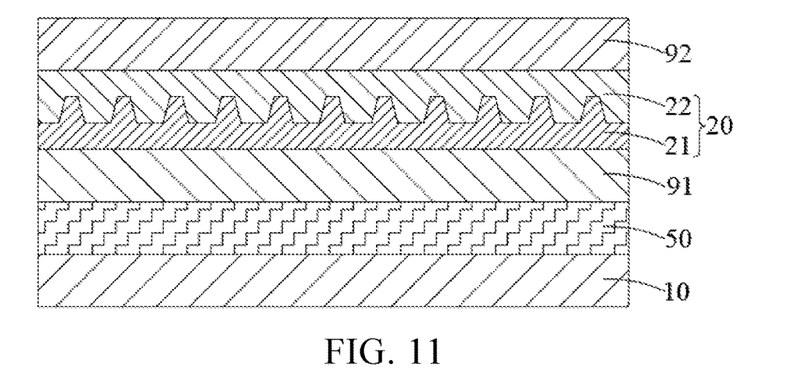
FIG. 11 is a schematic view showing the present application after a second protective layer is disposed on the wide-viewing-angle film according to one embodiment.

Please refer to FIG. 10 and FIG. 11. FIG. 10 is a schematic view of the second light-transmissive layer disposed on the first light-transmissive layer according to one embodiment of the present application. FIG. 11 is a schematic view showing the present application after a second protective layer is disposed on the wide-viewing angle film according to one embodiment. In one example, after the second light-transmissive layer 22 is disposed on one side of the first light-transmissive layer 21 away from the substrate 10, a second protective layer 92 is disposed on one side of the second light-transmissive layer 22 away from the first light-transmissive layer 21. It can be understood that by disposing the second protective layer 92 on the surface of the second light-transmissive layer 22, the second light-transmissive layer 22 and the first light-transmissive layer 21 can be protected, thereby prolonging the service life of the wide-viewing-angle film 20.

In one example, a material of the second protective layer 92 can include at least one of organic materials such as triacetyl cellulose (TAC), polyethylene terephthalate (PET), cyclo olefin polymer (COP), and polymethyl methacrylate (PMMA).

In one example, the second light-transmissive layer 22 can be disposed at the substrate 10 by coating, and the material of the second light-transmissive layer 22 can be a photoresist material (e.g., a positive photoresist material or a negative photoresist material).

It can be understood that, after the second light-transmissive layer 22 is disposed on one side of the first light-transmissive layer 21 away from the substrate 10, the second light-transmissive layer 22 can fill the spaced regions between the protrusions 211, so that the second light-transmissive layer 22 can form a pattern complementary to the first light-transmissive layer 21. That is to say, the second light-transmissive layer 22 form grooves at positions corresponding to the protrusions 211, and the second light-transmissive layer 22 form protrusions at positions corresponding to the spaced regions between the protrusions 211.

In one example, the refractive index of the material of the first light-transmissive layer 21 is 1.5 to 2.3 (e.g., 1.5, 1.6, 1.7, 1.8, 1.9, 2.0, 2.1, 2.2, and 2.3), and the refractive index of the material of the second light-transmissive layer 22 is 1.6 to 2.4 (e.g., 1.6, 1.7, 1.8, 1.9, 2.0, 2.1, 2.2, 2.3, and 2.4).

In one example, the thickness of the material of the first light-transmissive layer 21 is 2 m to 20 m (e.g., 2 m, 5 m, 10 m, 12 m, 15 m, 17 m, and 20 m), and a thickness of the material of the second light-transmissive layer 22 is 10 m to 30 m (e.g., 10 m, 12 m, 15 m, 17 m, 20 m, 22 m, 25 m, 27 m, and 30 m).

Figure 12:
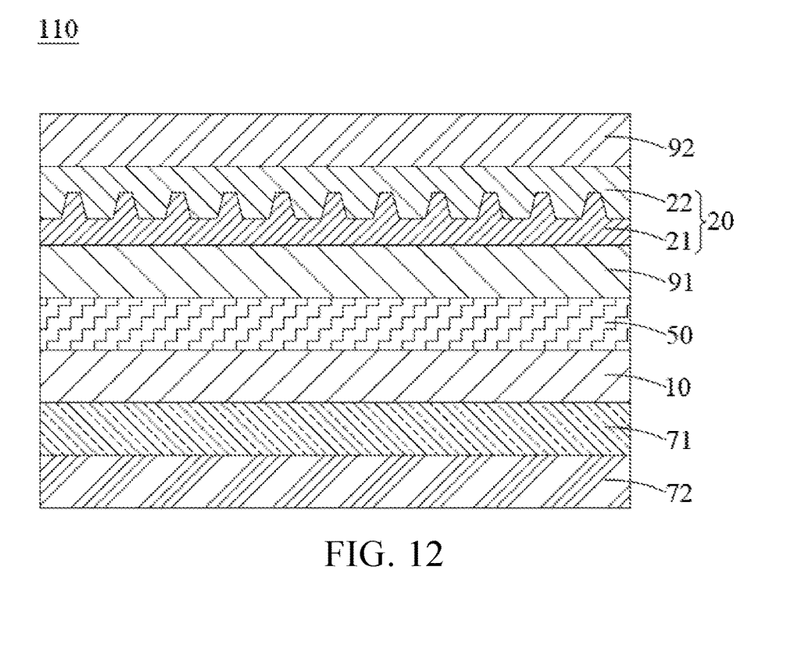
FIG. 12 is a schematic view showing the present application after an adhesive layer and a release layer are disposed on one side of the substrate according to one embodiment.

Please refer to FIG. 12. FIG. 12 is a schematic view showing the present application after an adhesive layer and a release layer are disposed on one side of the substrate according to one embodiment. After the wide-viewing-angle film 20 is obtained, an adhesive layer 71 and a release layer 72 can also be stacked in sequence on one side of the substrate 10 away from the wide-viewing-angle film 20. It can be understood that the adhesive layer 71 can be used to adhere the wide-viewing-angle optical film 110 to a liquid crystal display panel 120. The release layer 72 can be used to protect the adhesive layer 71 during transportation and storage of the wide-viewing-angle optical film 110, so that the adhesive layer 71 is prevented from being dry and losing stickiness.

In one example, a material of the adhesive layer 71 can be a pressure sensitive adhesive (PSA), and a material of the release layer 72 can be polyethylene terephthalate (PET) or the like.

In the manufacturing method of the wide-viewing-angle optical film according to one embodiment of the present application, the first light-transmissive layer 21 forms multiple protrusions 211 by performing light treatment on the first light-transmissive layer 21. Compared with conventional techniques which produce the protrusions 211 by a pressing method, the present application does not require a pressing mold, thus eliminating problems like great difficulty in make the pressing mold and high production costs in conventional manufacturing methods of the wide-viewing-angle optical film. Moreover, the present application can simplify the production process of the wide-viewing-angle optical film 110, reduce the difficulty in producing the wide-viewing-angle optical film 110, and reduce the production costs of the wide-viewing-angle optical film 110.

Please refer to FIG. 12. The present application further provides a wide-viewing-angle optical film 110 which can be produced using the manufacturing method of the wide-viewing-angle optical film in any of the above embodiments. The wide-viewing-angle optical film 110 includes a substrate 10 and a wide-viewing-angle film 20 at one side of the substrate 10.

Referring to FIG. 12, the wide-viewing-angle optical film 110 can further include a polarizing film 50 disposed between the substrate 10 and the wide-viewing-angle film 20. It can be understood that when the polarizing film 50 is disposed in the wide-viewing-angle optical film 110, the wide-viewing-angle optical film 110 not only can scatter light and widen a range of viewing angles of a liquid crystal display device 100, but also has functions of a polarizer.

Please refer to FIG. 3. In one example, the polarizing film 50 can include an alignment material 61 and iodine 52 attached to the alignment material 61.

Referring to FIG. 12, the wide-viewing-angle optical film 110 can further include an adhesive layer 71 and a release layer 72. The release layer 72 is disposed at one side of the substrate 10 away from the wide-viewing-angle film 20, and the adhesive layer 71 is disposed between the substrate 10 and the release layer 72. It can be understood that, during use, the release layer 72 can be peeled off from the adhesive layer 71, and the wide-viewing-angle optical film 110 can be attached to a liquid crystal display panel 120 by using the adhesive layer 71.

Figure 13:
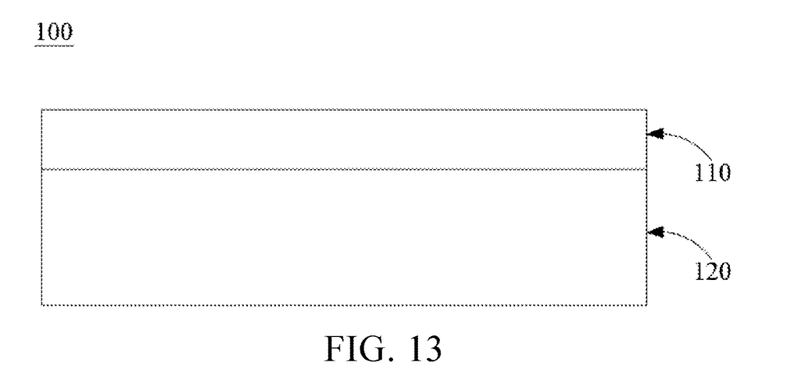
FIG. 13 is a schematic structural view of a liquid crystal display device according to one embodiment of the present application.

Please refer to FIG. 13 in conjunction with FIG. 12. FIG. 13 is a schematic structural view of the liquid crystal display device according to one embodiment of the present application. The present application further provides a liquid crystal display device 100, including a liquid crystal display panel 120 and a wide-viewing-angle optical film 110. The wide-viewing-angle optical film 110 is disposed on a light-emitting side of the liquid crystal display panel 120, and the wide-viewing-angle optical film 110 can be the wide-viewing-angle optical film 110 in any of the above embodiments.

Please refer to FIG. 12. It can be understood that when the wide-viewing-angle optical film 110 is used in the liquid crystal display device 100, one side of the substrate 10 of the wide-viewing-angle optical film 110 is away from the wide-viewing-angle film 20 and faces the liquid crystal display panel 120.

The wide-viewing-angle optical film, the manufacturing method thereof, and the liquid crystal display device of the present application have been described in detail above. The working principles and embodiments of the present application are described herein by using specific examples. The descriptions of the above embodiments are only used for ease of understanding the present application. Those skilled in the art can still change the specific embodiments and application range according to the ideas of the present application. In summary, the content of this specification should not be construed as a limitation to the present application.

What is claimed is:

1. A manufacturing method of a wide-viewing-angle optical film, the wide-viewing-angle optical film disposed on a light-emitting side of a liquid crystal display panel, the manufacturing method comprising:
providing a substrate and forming a first light-transmissive layer at one side of the substrate;
performing light treatment to pattern the first light-transmissive layer by using a photomask, so that multiple protrusions are formed on a surface of the first light-transmissive layer, wherein a material of the first light-transmissive layer is a photoresist material, wherein a width of a bottom side of each of the protrusions is W, a distance between any two adjacent protrusions is P, $1<P/W \leq 10$, and a longitudinal cross-section of each of the protrusions is an isosceles trapezoid; and
forming a second light-transmissive layer on one side of the first light-transmissive layer away from the substrate, wherein a refractive index of a material of the second light-transmissive layer is greater than a refractive index of the material of the first light-transmissive layer, so that a wide-viewing-angle film is obtained, the wide-viewing-angle film comprises the first light-transmissive layer and the second light-transmissive layer stacked on each other, and the first light-transmissive layer is disposed on one side of the second light-transmissive layer closer to the liquid crystal display panel.

2. The manufacturing method of the wide-viewing-angle optical film according to claim 1, wherein the photoresist material of the first light-transmissive layer is a positive photoresist material; and the step of performing the light treatment to pattern the first light-transmissive layer by using the photomask comprises:
providing the photomask, wherein the photomask is a first mask, and the first mask comprises multiple first light-shielding regions arranged at intervals and multiple first light-transmissive regions arranged around the first light-shielding regions;
disposing the first mask between a light source and the first light-transmissive layer, so that light emitted by the light source passes through the first light-transmissive regions and irradiates the first light-transmissive layer; and
developing the first light-transmissive layer, so that a thickness of the first light-transmissive layer is reduced in areas corresponding to the first light-transmissive regions, and the first light-transmissive layer forms the protrusions at positions corresponding to the first light-shielding regions.

3. The manufacturing method of the wide-viewing-angle optical film according to claim 1, wherein the photoresist material of the first light-transmissive layer is a negative photoresist material; and the step of performing the light treatment to pattern the first light-transmissive layer by using the photomask comprises:
- providing the photomask, wherein the photomask is a second mask, and the second mask comprises multiple second light-transmissive regions arranged at intervals and multiple second light-shielding regions arranged around the second light-transmissive regions;
- disposing the second mask between a light source and the first light-transmissive layer, so that the light emitted by the light source passes through the second light-transmissive regions and irradiates the first light-transmissive layer; and
- developing the first light-transmissive layer, wherein a thickness of the first light-transmissive layer is reduced in areas corresponding to the second light-shielding regions, so that the first light-transmissive layer forms the protrusions at positions corresponding to the second light-transmissive regions.

4. The manufacturing method of the wide-viewing-angle optical film according to claim 1, wherein before the first light-transmissive layer is disposed at one side of the substrate, the manufacturing method of the wide-viewing angle optical film further comprises:
- disposing a polarizing film on the substrate, wherein the polarizing film is arranged between the substrate and the wide-viewing-angle film.

5. The manufacturing method of the wide-viewing-angle optical film according to claim 4, wherein the polarizing film is formed by coating.

6. The manufacturing method of the wide-viewing-angle optical film according to claim 5, wherein the step of disposing the polarizing film on the substrate comprises:
- coating an alignment material on the substrate and drying the alignment material to obtain an alignment layer;
- coating an iodine-containing material on a surface of the alignment layer;
- using a solvent to wash the surface of the alignment layer to remove a portion of the iodine-containing material that does not enter the alignment layer; and
- drying the alignment layer to form the polarizing film.

7. The manufacturing method of the wide-viewing-angle optical film according to claim 6, wherein the alignment material is a liquid crystal material, and the iodine-containing material is an iodine solution;
- the alignment material is dried by a drying method with drying temperatures of 40° C. to 60° C. and a drying time from 0.1 minute to 10 minutes; and
- the alignment layer is dried by the drying method with the drying temperatures of 40° C. to 60° C. and the drying time from 0.1 minute to 10 minutes.

8. A wide-viewing-angle optical film, produced using the manufacturing method of the wide-viewing-angle optical film of claim 1, wherein the wide-viewing-angle optical film comprises a substrate and a wide-viewing-angle film disposed at one side of the substrate.

9. The wide-viewing-angle optical film according to claim 8, further comprising a polarizing film arranged on the substrate, wherein the polarizing film is arranged between the substrate and the wide-viewing-angle film.

10. A liquid crystal display device, comprising:
- a liquid crystal display panel; and
- a wide-viewing-angle optical film arranged on a light-emitting side of the liquid crystal display panel, wherein the wide-viewing-angle optical film is the wide-viewing-angle optical film of claim 1.

11. The liquid crystal display device according to claim 10, further comprising a polarizing film arranged on the substrate, wherein the polarizing film is arranged between the substrate and the wide-viewing-angle film.

* * * * *